US008928268B2

United States Patent
Koo

(10) Patent No.: US 8,928,268 B2
(45) Date of Patent: Jan. 6, 2015

(54) SIGNAL DUTY DETECTING APPARATUS AND MOTOR DRIVING APPARATUS HAVING THE SAME

(75) Inventor: Bon Young Koo, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 228 days.

(21) Appl. No.: 13/585,335

(22) Filed: Aug. 14, 2012

(65) Prior Publication Data

US 2013/0320907 A1  Dec. 5, 2013

(30) Foreign Application Priority Data

May 30, 2012 (KR) ........................ 10-2012-0057388

(51) Int. Cl.
*H02P 1/30* (2006.01)
(52) U.S. Cl.
USPC ............................ 318/503; 318/567; 318/569
(58) Field of Classification Search
USPC ......... 318/503, 567, 569, 686, 603, 604, 608, 318/511, 568.24
See application file for complete search history.

(56) References Cited

U.S. PATENT DOCUMENTS

| 5,764,024 A | 6/1998 | Wilson |
| 2007/0164886 A1* | 7/2007 | Kim et al. ..................... 341/144 |
| 2008/0252271 A1 | 10/2008 | Iwamura |
| 2011/0260669 A1 | 10/2011 | Nakahata et al. |

FOREIGN PATENT DOCUMENTS

| JP | 2002-044981 A | 2/2002 |
| JP | 2004-088820 A1 | 3/2004 |
| JP | 2005-189522 A1 | 7/2005 |
| JP | 2008-271621 A | 11/2008 |
| JP | 2011-130532 A | 6/2011 |
| JP | 2011-229345 A | 11/2011 |
| JP | 2013-118745 A | 6/2013 |
| KR | 1998-081113 A | 11/1998 |

OTHER PUBLICATIONS

Korean Office Action issued in Korean Application No. 10-2012-0057388 dated Jun. 1, 2013 with English Translation.
Notice of Office Action Japanese Patent Application No. 2012-179783 dated Oct. 22, 2013.

\* cited by examiner

*Primary Examiner* — Karen Masih
(74) *Attorney, Agent, or Firm* — McDermott Will & Emery LLP

(57) ABSTRACT

There are provided a signal duty detecting apparatus detecting a duty of a pulse width modulation (PWM) signal by counting a signal, among signals present in a preset period of the PWM signal, having a predetermined level or higher and a motor driving apparatus having the same. The signal duty detecting apparatus includes: a level detector detecting levels of an input signal; a counter counting the levels detected by the level detector; and a duty calculator calculating a duty of the input signal based on the levels counted by the counter.

8 Claims, 5 Drawing Sheets

SIGNAL DUTY DETECTING APPARATUS AND MOTOR DRIVING APPARATUS HAVING THE SAME

CROSS-REFERENCE TO RELATED APPLICATIONS

This application claims the priority of Korean Patent Application No. 10-2012-0057388 filed on May 30, 2012, in the Korean Intellectual Property Office, the disclosure of which is incorporated herein by reference.

BACKGROUND OF THE INVENTION

1. Field of the Invention

The present invention relates to a signal duty detecting apparatus capable of detecting a duty of a signal, specifically, a duty of a pulse width modulation (PWM) signal and a motor driving apparatus having the same.

2. Description of the Related Art

A brushless direct current (BLDC) motor generally means a DC motor able to conduct current or having a function able to adjust a current direction using a non-contact position detector and a semiconductor element, rather than using a mechanical contact such as a brush, a commutator, or the like, in a DC motor.

In order to drive a BLDC motor, a driving apparatus may be used.

FIG. 1 shows a configuration of a general motor driving apparatus.

Referring to FIG. 1, a general motor driving apparatus 10 may include a controlling unit 11 and a driving unit 12.

The controlling unit 11 may control driving of the motor, and the driving unit 12 may drive the motor by turning four field effect transistors (FETs) on or off, according to a driving signal of the controlling unit 11.

FIG. 2 shows driving signals of the motor driving apparatus.

Referring to FIG. 2, the driving signals transferred from the controlling unit 11 to the driving unit 12 may be divided into four types of driving signals and transferred in a sequence of identification numbers ①, ②, ③, and ④.

That is, a first PMOS FET P1 and a second NMOS FET N2 may be turned on by a driving signal ①, and the first PMOS FET P1 and the second NMOS FET N2 may be turned off while a second PMOS FET P2 and a first NMOS FET N1 may be turned on by a driving signal ②.

Again, the second PMOS FET P2 and the first NMOS FET N1 may be turned off while the first PMOS FET P1 and the second NMOS FET N2 may be turned on by a driving signal ③, and the first PMOS FET P1 and the second NMOS FET N2 may be turned off while the second PMOS FET P2 and the first NMOS FET N1 may be turned on by a driving signal ④.

In this driving scheme, when the first PMOS FET P1 and the second PMOS FET P2 are turned on, pulse width modulation (PWM) signals (depicted as oblique line portions in FIG. 2) are generated, whereby a speed of the motor may be controlled.

FIG. 3 is an on-duty graph of a general PWM signal.

Referring to FIG. 3, the on-duty graph of a general PWM signal may have a rectangular shape.

As described above, the PWM signal may be used to drive the motor and the speed of the motor may be controlled according to an on-duty of the PWM signal. Therefore, as disclosed in the Related Art Document, a duty of the PWM signal is detected in order to precisely control the speed of the motor. Generally, in order to detect the duty of the PWM signal, a rising edge or a falling edge of the PWM signal is detected. To this end, a clock signal having a predetermined frequency is used.

However, in the case of a scheme of detecting the rising edge or the falling edge of the PWM signal using the clock signal, it may be difficult to detect an on-duty of 0% or an on-duty of 100% of the PWM signal, and an error may be generated due to the frequency of the clock signal.

RELATED ART DOCUMENT (Patent Document 1) Korean Patent Laid-open Publication No. 10-1998-0081113

SUMMARY OF THE INVENTION

An aspect of the present invention provides a signal duty detecting apparatus detecting a duty of a pulse width modulation (PWM) signal by counting a signal, among signals present in a preset period of the PWM signal, having a predetermined level or higher and a motor driving apparatus having the same.

According to an aspect of the present invention, there is provided a signal duty detecting apparatus including: a level detector detecting levels of an input signal; a counter counting the levels detected by the level detector; and a duty calculator calculating a duty of the input signal based on the levels counted by the counter.

The signal duty detecting apparatus may further include a timer providing a preset time to at least one of the level detector, the counter, and the duty calculator.

The input signal may be a pulse width modulation (PWM) signal having a preset duty.

The level detector may detect a level equal to a preset reference level or higher or equal to the preset reference level or lower, among the levels of the input signal.

The signal duty detecting apparatus may further include a frequency/period detector detecting a frequency and a period of the input signal.

The signal duty detecting apparatus may further include a period setter providing a preset period.

The signal duty detecting apparatus may further include a selector selecting the period of the period setter according to information detected by the frequency/period detector; and a comparator comparing a time of the period selected by the selector with a time provided by the timer to provide a comparison result to the duty calculator.

According to another aspect of the present invention, there is provided a motor driving apparatus including: a detecting unit including a level detector detecting levels of an input signal, a counter counting the levels detected by the level detector, and a duty calculator calculating a duty of the input signal based on the levels counted by the counter; a driving signal generating unit generating driving signals according to the duty calculated by the detecting unit; a driving controlling unit providing driving control signals having a power level required for driving a motor based on the driving signals from the driving signal generating unit; and a driving unit driving the motor according to the driving control signals from the driving controlling unit.

The detecting unit may further include a timer providing a preset time to at least one of the level detector, the counter, and the duty calculator.

The detecting unit may further include a frequency/period detector detecting a frequency and a period of the input signal.

The detecting unit may further include a period setter providing a preset period.

The detecting unit may further include a selector selecting the period of the period setter according to information detected by the frequency/period detector; and a comparator comparing a time of the period selected by the selector with a time provided by the timer to provide a comparison result to the duty calculator.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
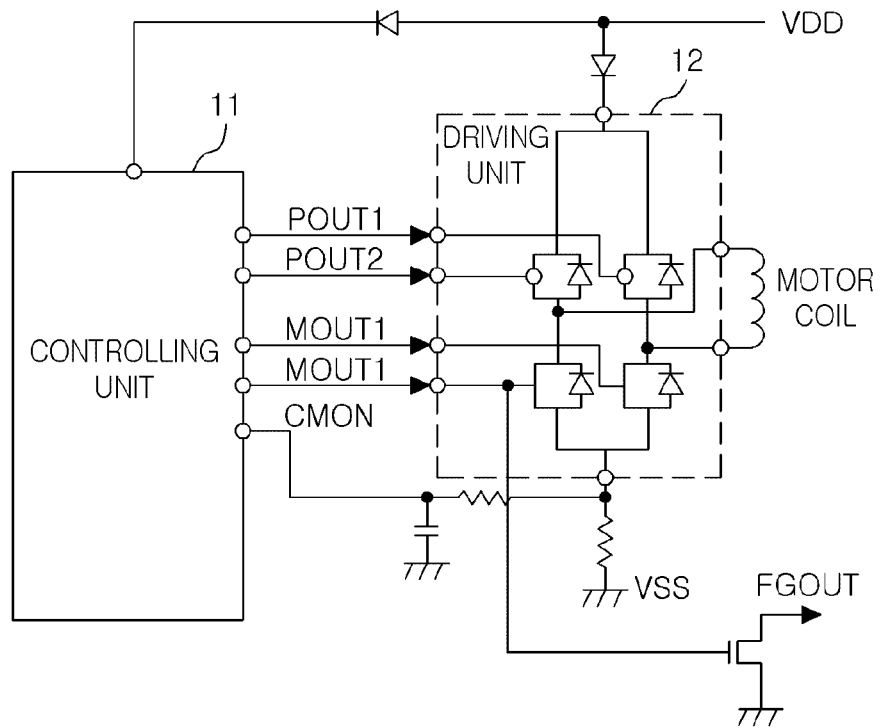
FIG. 1 is a diagram showing a configuration of a general motor driving apparatus.
Figure 2:
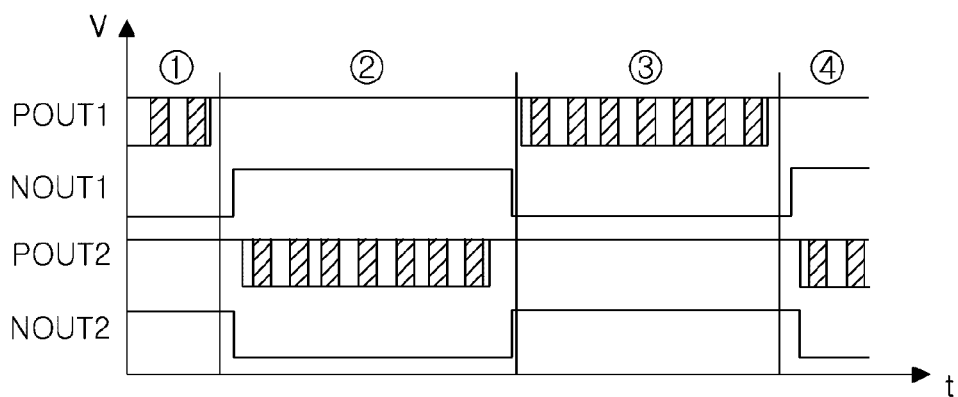
FIG. 2 is a diagram showing driving signals of the motor driving apparatus.
Figure 3:
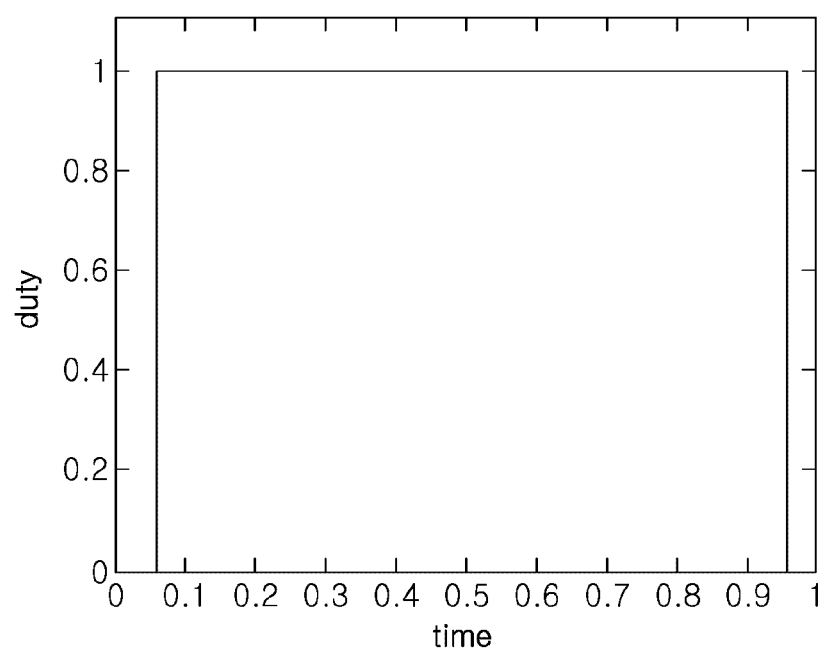
FIG. 3 is an on-duty graph of a general pulse width modulation (PWM) signal.

Hereinafter, embodiments of the present invention will be described in detail with reference to the accompanying drawings so that they can be easily practiced by those skilled in the art to which the present invention pertains.

However, in describing embodiments of the present invention, detailed descriptions of well-known functions or constructions will be omitted so as not to obscure the description of the present invention with unnecessary detail.

In addition, like or similar reference numerals denote parts performing similar functions and actions throughout the drawings.

It will be understood that when an element is referred to as being "connected to" another element, it can be directly connected to the other element or may be indirectly connected with the other element with element(s) interposed therebetween.

In addition, unless explicitly described to the contrary, the word "comprise" and variations such as "comprises" or "comprising," will be understood to imply the inclusion of stated elements but not the exclusion of any other elements.

Embodiments of the present invention will now be described in detail with reference to the accompanying drawings.

Figure 4:
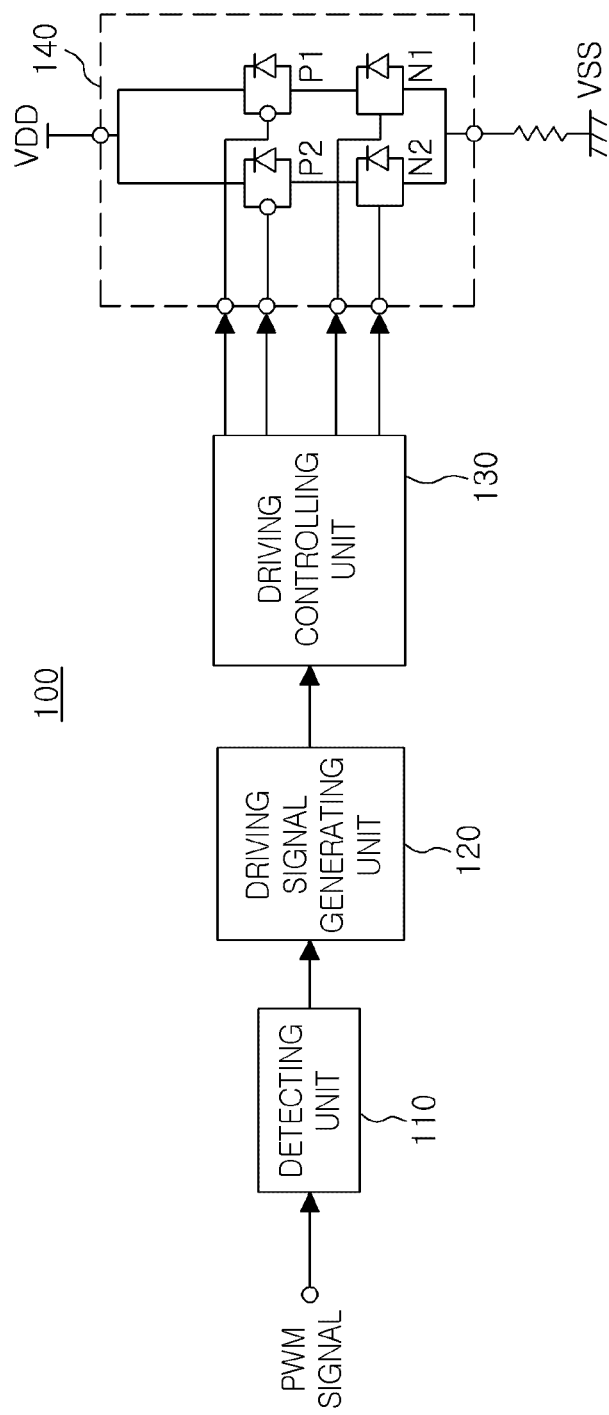
FIG. 4 is a schematic diagram showing a configuration of a motor driving apparatus according to an embodiment of the present invention.

FIG. 4 is a schematic diagram showing a configuration of a motor driving apparatus according to an embodiment of the present invention.

Referring to FIG. 4, a motor driving apparatus 100 according to an embodiment of the present invention may include a detecting unit 110, a driving signal generating unit 120, a driving controlling unit 130, and a driving unit 140.

The detecting unit 110 may detect a level of an input signal, particularly, a PWM signal to calculate a duty of the PWM signal. A detailed configuration of the detecting unit 110 will be described in detail with reference to FIGS. 5 and 6.

The driving signal generating unit 120 may provide driving signals for soft-switching switches of the driving unit 140.

More specifically, the driving signal generating unit 120 may provide the driving signals according to the duty of the PWM signal calculated by the detecting unit 110, and the driving controlling unit 130 may receive the driving signals from the driving signal generating unit 120 and provide driving control signals having a power level capable of driving the switches of the driving unit 140 to the driving unit 140, according to the driving signals.

The driving unit 140 may include a total of four switches, wherein the four switches may be formed of two P-channel metal oxide semiconductor field effect transistors (PMOS FETs) P1 and P2 and two N-channel metal oxide semiconductor field effect transistors (NMOS FETs) N1 and N2.

A first PMOS FET P1 may be electrically connected between a power supply terminal from which power VDD is supplied and a ground VSS, and a first NMOS FET N1 may be electrically connected between the first PMOS FET P1 and the ground.

A second PMOS FET P2 may be connected to the power supply terminal in parallel with the first PMOS FET P1 and be electrically connected between the power supply terminal and the ground, and a second NMOS FET N2 may be electrically connected between the second PMOS FET P2 and the ground.

Figure 5:
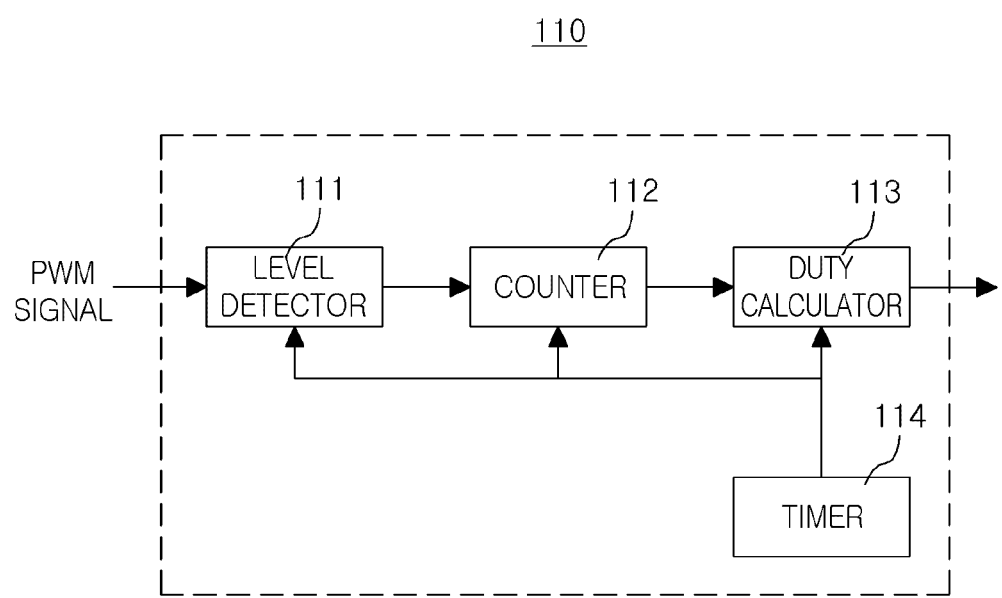
FIG. 5 is a diagram showing a detecting unit used in the motor driving apparatus according to the embodiment of the present invention.

FIG. 5 is a diagram showing a detecting unit used in the motor driving apparatus according to the embodiment of the present invention.

Referring to FIG. 5, the detecting unit 110 used in the motor driving apparatus according to the embodiment of the present invention may include a level detector 111, a counter 112, and a duty calculator 113, and may further include a timer 114.

The level detector 111 may detect levels of a PWM signal. Here, the level detector 111 may only detect a level of the PWM signal equal to a preset reference level or higher or equal to the preset reference level or lower among the levels of the PWM signal. Therefore, the level detector 111 may allow the duty calculator 113 to calculate an on-duty or an off-duty of the PWM signal later. In addition, the level detector 111 may detect the levels of the PWM signal during a time provided by the timer 114.

The counter 112 may count the levels of the PWM signal detected by the level detector 111. Likewise, the counter 112 may count the levels of the PWM signal detected during the time provided by the timer 114.

The duty calculator 113 may calculate a duty of the PWM signal based on the levels of the PWM signal counted by the counter 112. Likewise, the duty calculator 113 may calculate the duty of the PWM signal during the time provided by the timer 114.

The timer 114 may provide a preset time to the level detector 111, the counter 112, and the duty calculator 113, and the time provided to the level detector 111, the counter 112, and the duty calculator 113 may be the same. The above-mentioned time may be set to include a plurality of periods of the PWM signal. Therefore, the detecting unit 110 may count levels of an on-duty or levels of an off-duty of the PWM signal during the plurality of periods of the PWM signal to accurately detect the duty of the PWM signal while preventing an error generated due to noise. Therefore, the longer the time provided by the timer 114, that is, the larger the periods of the PWM signal included in the provided time, the more accurate the detection of the duty is.

Meanwhile, the periods of the PWM signal may be varied. Therefore, in the case in which the time of the timer 114 is fixed, when a frequency of the PWM signal is high, a detection time may increase longer than required, and when the frequency of the PWM signal is low, the number of periods of the PWM signal during the detection time may decrease to deteriorate accuracy of the duty.

Therefore, a detecting unit according to another embodiment of the present invention as described below may be considered.

Figure 6:
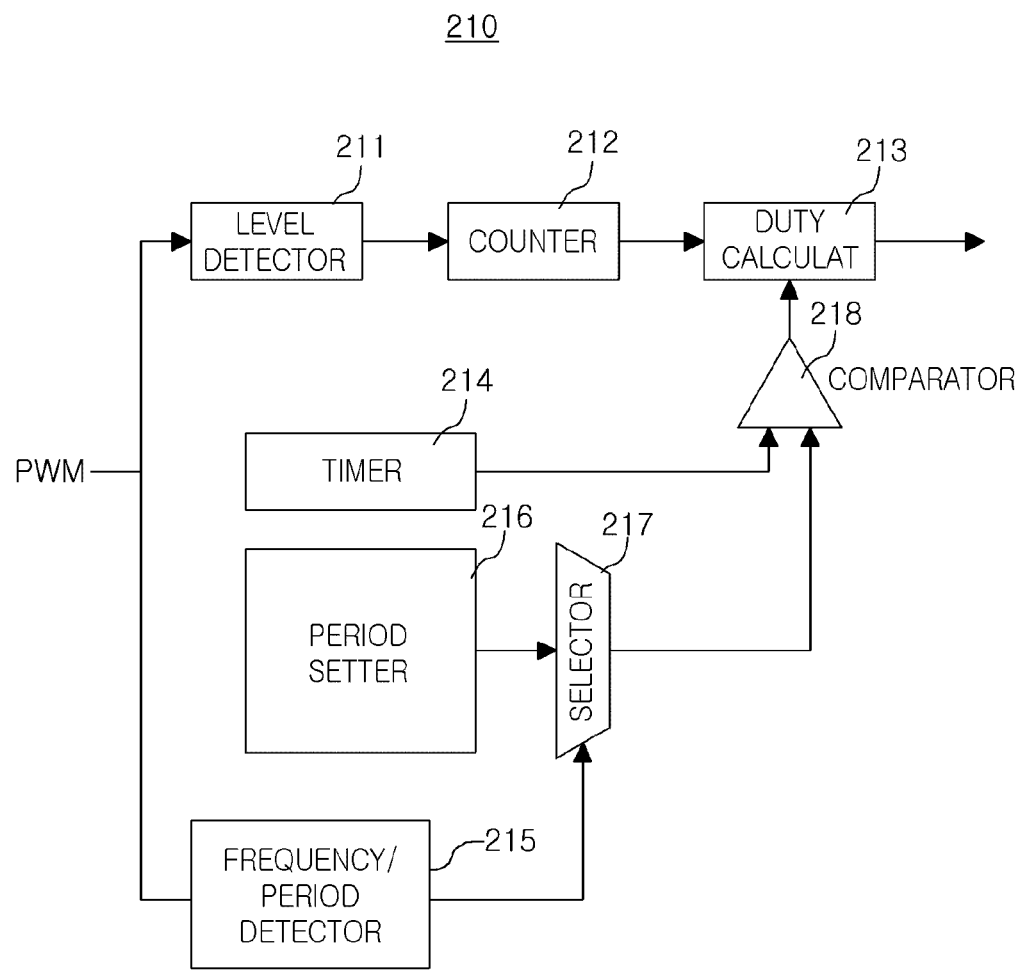
FIG. 6 is a diagram showing a detecting unit used in a motor driving apparatus according to another embodiment of the present invention.

FIG. 6 is a diagram showing a detecting unit used in a motor driving apparatus according to another embodiment of the present invention.

Referring to FIG. 6, a detecting unit 210 used in the motor driving apparatus according to another embodiment of the present invention may include a level detector 211, a counter 212, and a duty calculator 213 that are the same as the elements shown in FIG. 5, and may further include a timer 214, a frequency/period detector 215, a period setter 216, a selector 217, and a comparator 218.

The timer 214 may provide a preset time, and the frequency/period detector 215 may detect a frequency and a period of a PWM signal. The frequency setter 216 may have various preset periods, and the selector 217 may select a period set in the period setter 216, based on the frequency and the period of the PWM signal detected by the frequency/period detector 215. The comparator 218 may compare the time from the timer 214 with the period of the selector 217 to provide an appropriate time (including the periods) or period to the duty calculator 213. Although not shown, the time or the period by the comparator 218 may be provided to the level detector 211 and the counter 212.

As described above, the detecting unit 210 according another embodiment of the present invention may detect the duty of the PWM signal during the preset time of the timer 214 or detect the frequency and the period of the PWM signal in the case in which the periods of the PWM signal are varied, thereby detecting the duty of the PWM signal during an appropriate period. Therefore, the detecting unit 210 may accurately detect the duty of the PWM signal, even in the case that the frequency and the periods of the PWM signal are varied.

As described above, according to the embodiment of the present invention, the rising edge or the falling edge of the PWM signal is not detected, but a signal having a predetermined level or higher is counted among signals present in a preset period to detect the duty of the PWM signal, whereby the duty of the PWM signal may be accurately detected and the generation of an error in the duty of the PWM signal may be prevented.

As set forth above, according to embodiments of the present invention, a duty of a PWM signal is detected by counting a signal having a predetermined level or higher among signals present in a preset period of the PWM signal, whereby the duty of the PWM signal may be accurately detected.

While the present invention has been shown and described in connection with the embodiments, it will be apparent to those skilled in the art that modifications and variations can be made without departing from the spirit and scope of the invention as defined by the appended claims.

What is claimed is:

1. A signal duty detecting apparatus comprising:
a level detector detecting levels of an input signal;
a counter counting the levels detected by the level detector;
a duty calculator calculating a duty of the input signal based on the levels counted by the counter;
a timer providing a preset time to at least one of the level detector, the counter, and the duty calculator;
a frequency/period detector detecting a frequency and a period of the input signal; and
a period setter providing a preset period.

2. The signal duty detecting apparatus of claim 1, wherein the input signal is a pulse width modulation (PWM) signal having a preset duty.

3. The signal duty detecting apparatus of claim 1, wherein the level detector detects a level equal to a preset reference level or higher or equal to the preset reference level or lower, among the levels of the input signal.

4. The signal duty detecting apparatus of claim 1, further comprising:
a selector selecting the period of the period setter according to information detected by the frequency/period detector; and
a comparator comparing a time of the period selected by the selector with a time provided by the timer to provide a comparison result to the duty calculator.

5. A motor driving apparatus comprising:
a detecting unit including a level detector detecting levels of an input signal, a counter counting the levels detected by the level detector, and a duty calculator calculating a duty of the input signal based on the levels counted by the counter;
a driving signal generating unit generating driving signals according to the duty calculated by the detecting unit;
a driving controlling unit providing driving control signals having a power level required for driving a motor based on the driving signals from the driving signal generating unit; and
a driving unit driving the motor according to the driving control signals from the driving controlling unit,
wherein the detecting unit further includes:
a timer providing a preset time to at least one of the level detector, the counter, and the duty calculator;
a frequency/period detector detecting a frequency and a period of the input signal; and
a period setter providing a preset period.

6. The motor driving apparatus of claim 5, wherein the input signal is a PWM signal having a preset duty.

7. The motor driving apparatus of claim 5, wherein the level detector detects a level equal to a preset reference level or higher or equal to the preset reference level or lower, among the levels of the input signal.

8. The motor driving apparatus of claim 5, wherein the detecting unit further includes:
a selector selecting the period of the period setter according to information detected by the frequency/period detector; and
a comparator comparing a time of the period selected by the selector with a time provided by the timer to provide a comparison result to the duty calculator.

* * * * *